US012761298B2

(12) United States Patent
He et al.

(10) Patent No.: US 12,761,298 B2
(45) Date of Patent: Oct. 13, 2026

(54) METHOD AND APPARATUS FOR DETECTING A CLOSED LOOP IN MRI, AND MRI SYSTEM

(71) Applicant: Siemens Healthineers AG, Forchheim (DE)

(72) Inventors: Xu He, Shenzhen (CN); Luis Pedro Ribeiro Lopes, Shenzhen (CN); Fang Yong Sun, Shenzhen (CN); Hui Song, Shenzhen (CN); Jun Xiong, Shenzhen (CN); Kun Zhu, Shenzhen (CN)

(73) Assignee: Siemens Healthineers AG, Forchheim (DE)

( * ) Notice: Subject to any disclaimer, the term of this patent is extended or adjusted under 35 U.S.C. 154(b) by 189 days.

(21) Appl. No.: 18/890,974

(22) Filed: Sep. 20, 2024

(65) Prior Publication Data

US 2025/0093436 A1 Mar. 20, 2025

(30) Foreign Application Priority Data

Sep. 20, 2023 (CN) ......................... 202311221671.6

(51) Int. Cl.
*G01R 33/28* (2006.01)
*G01R 33/54* (2006.01)
*G06T 7/00* (2017.01)

(52) U.S. Cl.
CPC ........... *G01R 33/288* (2013.01); *G01R 33/54* (2013.01); *G06T 7/0012* (2013.01); (Continued)

(58) Field of Classification Search
None
See application file for complete search history.

(56) References Cited

U.S. PATENT DOCUMENTS 7,800,368 B2 * 9/2010 Vaughan .............. G01R 33/246 324/318
8,801,701 B2 * 8/2014 Chopra .................... A61B 5/01 606/27

(Continued)

FOREIGN PATENT DOCUMENTS

CN 1817303 A 8/2006
WO WO-2023036729 A1 * 3/2023 ............... A61B 5/70

OTHER PUBLICATIONS

Abdel-Rehim, S., et al.: “Burns from ECG Leads in an MRI scanner: Case Series and Discussion of Mechanisms” Ann Burns Fire Disasters. 27(31):215-218 (2014).

(Continued)

*Primary Examiner* — Anand P Bhatnagar
(74) *Attorney, Agent, or Firm* — Banner & Witcoff, Ltd.

(57) ABSTRACT

In an method for detecting a closed loop in MRI: 3D coordinates of key characteristic points of an MRI examination subject are acquired; the 3D coordinates of the key characteristic points are adapted to a 3D body standard model, to obtain a 3D virtual body model of the examination subject; 3D surface regions of pre-designated body parts are extracted from the 3D virtual body model; based on pre-defined body parts where skin contact is likely to occur, a distance between 3D surface regions of two body parts in each body part pair are calculated; and in response to the distance between the 3D surface regions of the two body parts in any body part pair being less than a preset first threshold, a risk of a closed loop in the examination subject is determined.

18 Claims, 7 Drawing Sheets

(52) U.S. Cl.
CPC ............... *G06T 2207/10024* (2013.01); *G06T 2207/10028* (2013.01); *G06T 2207/10088* (2013.01); *G06T 2207/20084* (2013.01); *G06T 2207/30004* (2013.01); *G06T 2207/30196* (2013.01)

(56) References Cited

U.S. PATENT DOCUMENTS

| | | | | |
|---|---|---|---|---|
| 10,048,333 | B2 * | 8/2018 | Fujita | H01F 5/04 |
| 11,672,465 | B2 * | 6/2023 | Luksic | A61B 5/364 600/515 |
| 2006/0183997 | A1 | 8/2006 | Haider et al. | |
| 2007/0239062 | A1 * | 10/2007 | Chopra | A61B 5/4381 600/549 |
| 2008/0129298 | A1 * | 6/2008 | Vaughan | G01R 33/546 324/322 |
| 2016/0356867 | A1 * | 12/2016 | Fujita | G01R 33/3642 |
| 2018/0177520 | A1 * | 6/2018 | Miller | A61B 34/10 |
| 2022/0260656 | A1 | 8/2022 | Hatakenaka et al. | |
| 2022/0270387 | A1 * | 8/2022 | Bai | G06T 17/00 |
| 2023/0120793 | A1 * | 4/2023 | Mellem | H01F 29/14 323/250 |
| 2025/0177737 | A1 * | 6/2025 | Choi | A61N 1/37 |

OTHER PUBLICATIONS

Watari T., et al.: "MRI Thermal Burn Injury: An Unrecognized Consequence of Wearing Novel, High-Tech Undergarments" QJM: An International Journal of Medicine; 111(1):495-496 (2018).

Pietryga, J. A., et al.: "Invisible Metallic Microfiber in Clothing Presents Unrecognized MRI Risk for Cutaneous Burn", American Journal of Neuroradiology. May 2013, 34 (5) E47-E50; DOI:10.3174/ajnr.A2827; (2013).

* cited by examiner

METHOD AND APPARATUS FOR DETECTING A CLOSED LOOP IN MRI, AND MRI SYSTEM

CROSS REFERENCE TO RELATED APPLICATIONS

This patent application claims priority to Chinese Patent Application No. 202311221671.6, filed Sep. 20, 2023, which is incorporated herein by reference in its entirety.

BACKGROUND

Technical Field

The present disclosure relates to the technical field of MRI (magnetic resonance imaging), in particular to a method and apparatus for detecting a closed loop in MRI, and an MRI system.

Related Art

In clinical scanning applications of MRI systems, due to the presence of gradient fields and high-frequency RF, if there is a closed loop in a part of the patient's body during scanning, a closed loop current will arise, generating heat. If the closed loop current is too large or the duration of scanning is long, enough heat will be generated to cause the patient to feel hot, or even burn the patient, seriously endangering the patient's safety.

Burning incidents during MRI scans are serious; many first-degree or second-degree burns have been reported. Statistical studies have shown that most MRI burns are caused by contact between body parts, such as overlapping skin, crossed legs or overlapping hands.

Closed loops during MRI scans are mainly due to the following three partial causes:

1. Crossed positioning of body parts of the patient. For example, when the patient is lying on the examination table in preparation for positioning a coil, the patient may unconsciously draw in parts of his or her body due to nervousness, and if the scan technician fails to notice the crossed parts of the patient during positioning and take corrective action, there is a risk that a closed loop will arise during scanning. Thus, burns due to crossed body parts are most common. Statistical studies have shown that about 77% of burns sustained are caused by skin contact between body parts of the patient. FIG. 1 shows examples of closed loops caused by skin contact between body parts of a patient; as shown in FIG. 1, skin contact between the two hands 11 and 12, the two feet 13, a hand and the torso 14 and 15, and the inner sides of the two thighs 16, etc. will result in closed loops.
2. Direct contact between the patient's skin and another object such as scanning equipment or a coil. For example, a closed loop might also arise if skin on a body part of the patient comes into direct contact with another object such as an outer wall of the scanning equipment or a coil, resulting in a risk of being burnt.
3. Metal implants in the patient's body, such as pacemakers, prosthetic limbs, stents, braces, etc. For example, before performing an MRI scan, the scan technician will ask the patient if there are any metal implants in his or her body, so burns due to such causes are rare.

At present, in a preparation stage prior to performing an MRI scan, the scan technician will always perform a manual inspection to prevent closed loops from arising. Since a patient might move his or her position or posture during positioning, the possibility of a closed loop arising is very difficult to eliminate completely.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
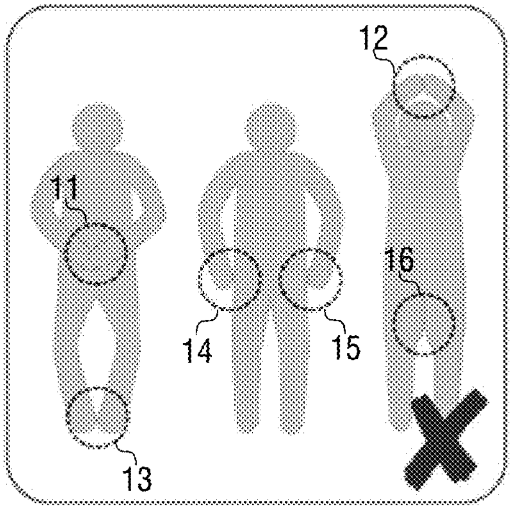
FIG. 1 shows examples of closed loops caused by skin contact between body parts of a patient according to one or more exemplary embodiments of the disclosure.

The exemplary embodiments of the present disclosure will be described with reference to the accompanying drawings. Elements, features and components that are identical, functionally identical and have the same effect are—insofar as is not stated otherwise-respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure is to provide a method and apparatus for detecting a closed loop in MRI, in order to detect a closed loop in an examination subject in MRI. Another object provides an MRI system to detect a closed loop in an examination subject in MRI.

A method for detecting a closed loop in magnetic resonance imaging (MRI) may include:

- acquiring 3D coordinates of key characteristic points of an MRI examination subject;
- adapting the 3D coordinates of the key characteristic points to a 3D body standard model, to obtain a 3D virtual body model of the examination subject;
- extracting 3D surface regions of pre-designated body parts from the 3D virtual body model;
- based on pre-defined body part pairs where skin contact is likely to occur, calculating a distance between 3D surface regions of the two body parts in each body part pair; and
- if the distance between the 3D surface regions of the two body parts in any body part pair is less than a preset first threshold, determining that there is currently a risk of a closed loop in the examination subject.

The step of acquiring 3D coordinates of key characteristic points of an MRI examination subject may comprise:

- acquiring an RGB image and a depth image of the MRI examination subject;
- detecting key characteristic points in the RGB image of the examination subject, and recording 2D coordinates of the key characteristic points; and
- acquiring 3D coordinates of the key characteristic points according to the 2D coordinates of the key characteristic points and the depth image of the examination subject.

The step of detecting key characteristic points in the RGB image of the examination subject may comprise: inputting the RGB image of the examination subject into a pre-trained deep learning network model for key characteristic point detection, to obtain 2D coordinates of key characteristic points of the examination subject.

After the step of acquiring 3D coordinates of key characteristic points of an MRI examination subject, but before the step of adapting the 3D coordinates of the key characteristic points to a 3D body standard model, the method may further comprise: converting the 3D coordinates of the key characteristic points to a pre-defined coordinate system.

After the step of acquiring 3D coordinates of key characteristic points of an MRI examination subject, the method may further comprise: detecting whether there is currently crossed positioning in the examination subject according to the 3D coordinates of the key characteristic points, and if so, determining that there is currently a risk of a closed loop in the examination subject.

The step of detecting whether there is currently crossed positioning in the examination subject, according to the 3D coordinates of the key characteristic points, may comprise:

- based on pre-defined key characteristic point pairs where crossed positioning is likely to occur and the 3D coordinates of the key characteristic points, calculating a distance between the two key characteristic points in each key characteristic point pair, and if the distance between the two key characteristic points in any key characteristic point pair is less than a preset second threshold, determining that there is currently crossed positioning in the examination subject; and/or
- inputting the 3D coordinates of the key characteristic points of the examination subject into a pre-trained deep learning network model for crossed positioning detection, so as to detect whether there is currently crossed positioning in the examination subject.

If the distance between the 3D surface regions of the two body parts in any body part pair is less than the preset first threshold, the method may further comprise the following before the step of determining that there is currently a risk of a closed loop in the examination subject: judging whether it is detected that there is currently crossed positioning in the examination subject, and if so, determining that there is currently a risk of a closed loop in the examination subject.

After the step of determining that there is currently a risk of a closed loop in the examination subject, the method may further comprise: issuing a closed loop alert to the examination subject; and/or issuing a closed loop alert to the examination subject and giving guidance for correct positioning.

An apparatus for detecting a closed loop in magnetic resonance imaging (MRI) may comprise:

- a key characteristic point acquisition module adapted to acquire 3D coordinates of key characteristic points of an MRI examination subject;
- a 3D surface region extraction module adapted to: adapt the 3D coordinates of the key characteristic points to a 3D body standard model, to obtain a 3D virtual body model of the examination subject, and extract 3D surface regions of pre-designated body parts from the 3D virtual body model; and
- a skin contact detection module adapted to: calculate, based on pre-defined body part pairs where skin contact is likely to occur, a distance between 3D surface regions of the two body parts in each body part pair, and if the distance between the 3D surface regions of the two body parts in any body part pair is less than a preset first threshold, determine that there is currently a risk of a closed loop in the examination subject.

The key characteristic point acquisition module acquiring 3D coordinates of key characteristic points of an MRI examination subject may comprise:

- acquiring an RGB image and a depth image of the MRI examination subject;
- detecting key characteristic points in the RGB image of the examination subject, and recording 2D coordinates of the key characteristic points; and
- acquiring 3D coordinates of the key characteristic points according to the 2D coordinates of the key characteristic points and the depth image of the examination subject.

To detect key characteristic points in the RGB image of the examination subject, the key characteristic point acquisition module may be adapted to: input the RGB image of the examination subject into a pre-trained deep learning network model for key characteristic point detection, to obtain 2D coordinates of key characteristic points of the examination subject.

After the key characteristic point acquisition module has acquired 3D coordinates of key characteristic points of an MRI examination subject, the 3D coordinates of the key characteristic points may be converted to a pre-defined coordinate system.

The apparatus may further comprise: a crossed positioning detection module adapted to detect whether there is currently crossed positioning in the examination subject according to the 3D coordinates of the key characteristic points, and if so, determine that there is currently a risk of a closed loop in the examination subject.

The crossed positioning detection module detecting whether there is currently crossed positioning in the examination subject, according to the 3D coordinates of the key characteristic points, may comprise:

based on pre-defined key characteristic point pairs where crossed positioning is likely to occur and the 3D coordinates of the key characteristic points, calculating a distance between the two key characteristic points in each key characteristic point pair, and if the distance between the two key characteristic points in any key characteristic point pair is less than a preset second threshold, determining that there is currently crossed positioning in the examination subject; and/or inputting the 3D coordinates of the key characteristic points of the examination subject into a pre-trained deep learning network model for crossed positioning detection, so as to detect whether there is currently crossed positioning in the examination subject.

After the skin contact detection module has determined that the distance between the 3D surface regions of the two body parts in any body part pair is less than the preset first threshold, but before determining that there is currently a risk of a closed loop in the examination subject, the following operations may be performed:

judging whether the crossed positioning detection module detects that there is currently crossed positioning in the examination subject, and if so, determining that there is currently a risk of a closed loop in the examination subject.

After the skin contact detection module has determined that there is currently a risk of a closed loop in the examination subject, the following operations may be performed: issuing a closed loop alert to the examination subject; and/or issuing a closed loop alert to the examination subject and giving guidance for correct positioning.

A magnetic resonance imaging (MRI) system may include the apparatus for detecting a closed loop in magnetic resonance imaging (MRI) according to the disclosure. The MRI system may also include a magnetic resonance (MR) scanner configured to obtain MR image data from the examination subject.

In embodiments of the present disclosure, a closed loop in an examination subject in MRI can be detected by acquiring 3D coordinates of key characteristic points of the MRI examination subject, adapting the 3D coordinates of key characteristic points to a 3D body standard model to obtain a 3D virtual body model of the examination subject, then extracting 3D surface regions of pre-designated body parts from the 3D virtual body model, and based on pre-defined body part pairs where skin contact is likely to occur, calculating a distance between 3D surface regions of the two body parts in each body part pair, and determining that there is currently a risk of a closed loop in the examination subject if the distance between the 3D surface regions of the two body parts in any body part pair is less than a preset first threshold.

Figure 2:
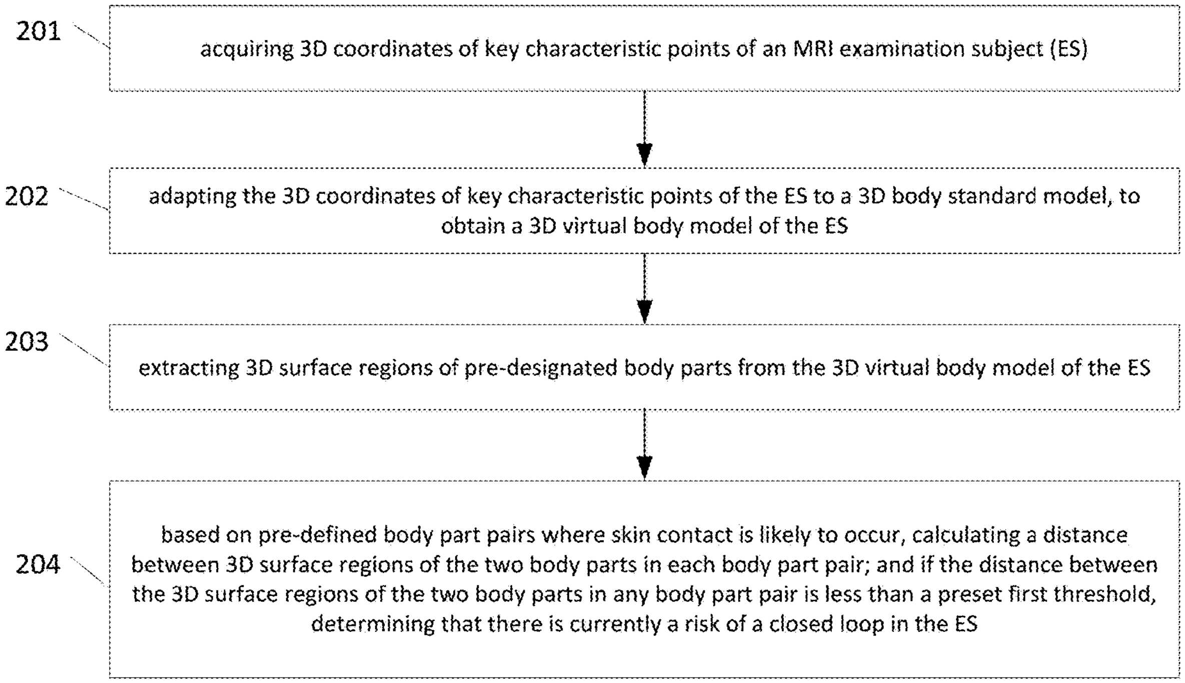
FIG. 2 is a flowchart of a method for detecting a closed loop in MRI according to one or more exemplary embodiments of the disclosure.

FIG. 2 is a flow chart of a method for detecting a closed loop in MRI as provided in an embodiment of the present disclosure, the specific steps of the method may include:

Step 201: acquiring 3D coordinates of key characteristic points of an MRI examination subject.

In an exemplary embodiment, this step 201 may comprise: acquiring an RGB image and a depth image of the examination subject; detecting key characteristic points in the RGB image of the examination subject, and recording 2D coordinates of the key characteristic points; and acquiring 3D coordinates of the key characteristic points according to the 2D coordinates of the key characteristic points and the depth image of the examination subject.

Figure 3:
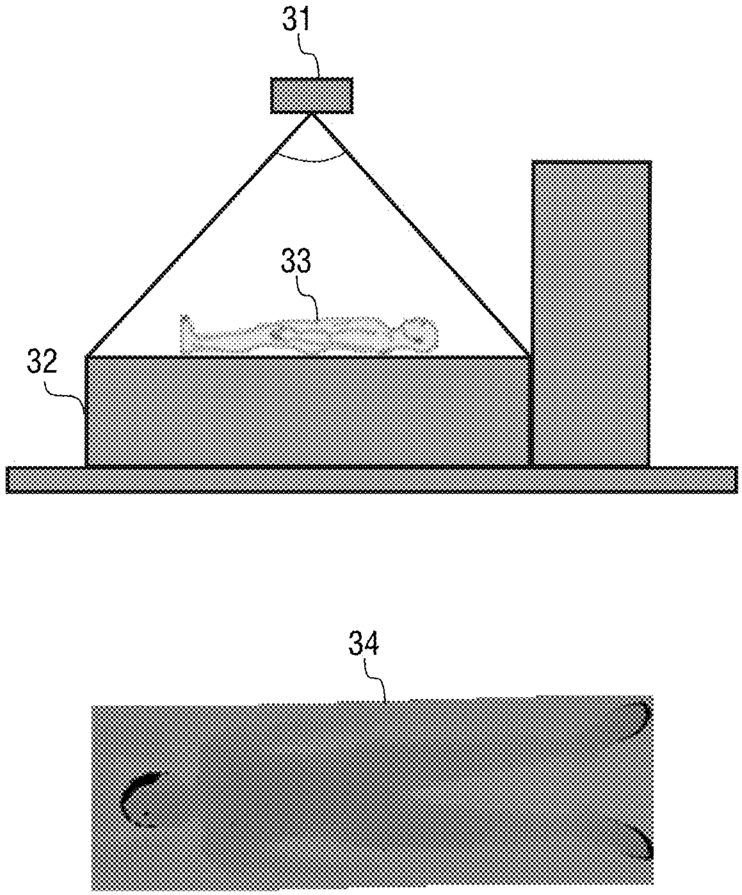
FIG. 3 is a schematic drawing showing a 3D camera being used to acquire an RGB image and a depth image of an examination subject according to one or more exemplary embodiments of the disclosure.

FIG. 3 is a schematic drawing showing a 3D camera being used to acquire an RGB image and a depth image of an examination subject in an application example of the present disclosure. 31 is a 3D camera, mounted directly above an examination table 32 of an MRI system and having a field of view which covers the examination table; 33 is an example of an examination subject, and 34 is an example of a depth image of an examination subject.

In actual applications, to acquire an RGB image and a depth image of the examination subject, a 3D camera may be used, or a depth camera+a color camera may be used; this embodiment imposes no restriction in this respect.

In an exemplary embodiment, the step of detecting key characteristic points in the RGB image of the examination subject may comprise: inputting the RGB image of the examination subject into a pre-trained deep learning network model for key characteristic point detection, to obtain 2D coordinates of key characteristic points of the examination subject.

The key characteristic points may be pre-defined, and at least include key joint points of the human body. Key characteristic points for example mean characteristic points of the following parts: the nose, left eye, right eye, left ear, right ear, left shoulder, right shoulder, left elbow, right elbow, left wrist, right wrist, left hip, right hip, left knee, right knee, left ankle, right ankle, etc.

Figure 4:
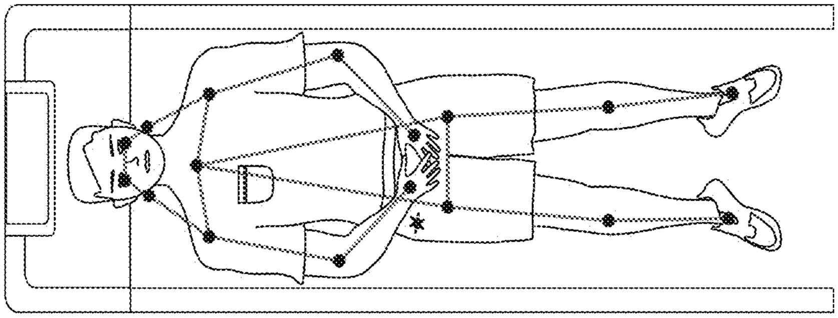
FIG. 4 illustrates the detection of key characteristic points in an RGB image of an examination subject according to one or more exemplary embodiments of the disclosure.

FIG. 4 is an exemplary drawing showing the detection of key characteristic points in an RGB image of an examination subject, provided in an application example of the present disclosure. Each little dot represents a key characteristic point.

In actual applications, after step 201 of acquiring 3D coordinates of key characteristic points of an MRI examination subject, the 3D coordinates of key characteristic points of the examination subject may further be converted to a pre-defined coordinate system.

"Examination subject" means a human body undergoing MRI.

Step 202: adapting the 3D coordinates of key characteristic points of the examination subject to a 3D body standard model, to obtain a 3D virtual body model of the examination subject.

This is a conventional step and will not be further described. Specifically, for example: the 3D coordinates of key characteristic points of the examination subject are compared with 3D coordinates of key characteristic points in the 3D body standard model, to obtain a position and posture of the examination subject, so as to determine a 3D virtual body model of the examination subject.

Figure 5:
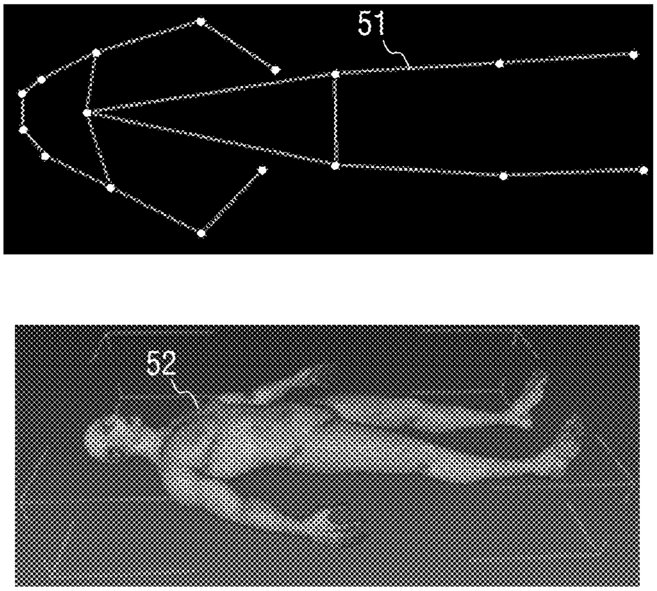
FIG. 5 shows the adaptation of 3D coordinates of key characteristic points of an examination subject to a 3D body standard model to obtain a 3D virtual body model of the examination subject according to one or more exemplary embodiments of the disclosure.

FIG. 5 is an exemplary drawing showing adaptation of 3D coordinates of key characteristic points of an examination subject to a 3D body standard model to obtain a 3D virtual body model of the examination subject, provided in an application example of the present disclosure. 51 is an example of key characteristic points of an examination subject; 52 is an example of a 3D virtual body model of the examination subject, obtained by adaptation.

Step 203: extracting 3D surface regions of pre-designated body parts from the 3D virtual body model of the examination subject.

"Pre-designated body parts" mean relevant body parts where skin contact is likely to occur, such as: the head, palms, arms, chest, abdomen, thighs, calves, feet, etc. For example, contact between the left and right palms, contact between either palm and the head, contact between either palm and the chest, contact between either palm and the abdomen, contact between the inner sides of the thighs, contact between the calves, and contact between the feet, etc. will all result in a closed loop.

After obtaining the 3D virtual body model of the examination subject, the position and range of the surface region of each body part on the 3D virtual body model can be ascertained, i.e. 3D coordinates of each point on the surface region of each body part can be ascertained.

Figure 6:
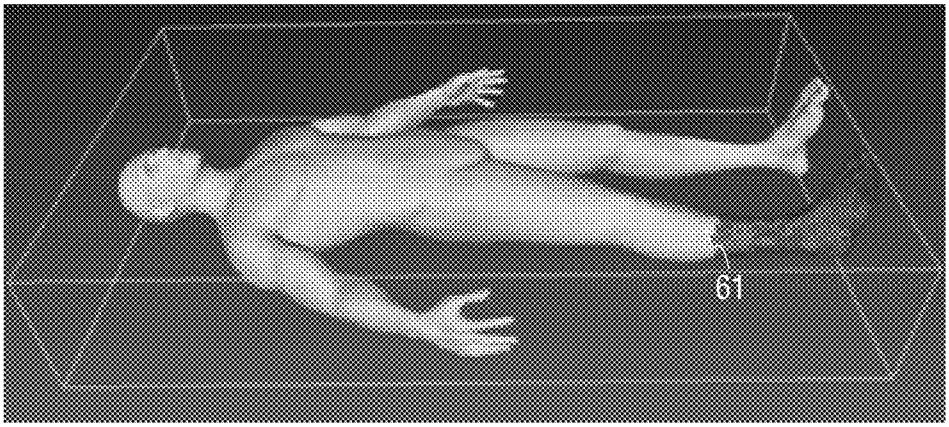
FIG. 6 shows the extraction of a 3D surface region of the right foot from a 3D virtual body model of an examination subject according to one or more exemplary embodiments of the disclosure.

FIG. 6 is an exemplary drawing showing the extraction of a 3D surface region of the right foot from a 3D virtual body model of an examination subject, in an application example of the present disclosure. The black patterned region 61 is a 3D surface region of the right foot.

Step 204: based on pre-defined body part pairs where skin contact is likely to occur, calculating a distance between 3D surface regions of the two body parts in each body part pair; and if the distance between the 3D surface regions of the two body parts in any body part pair is less than a preset first threshold, determining that there is currently a risk of a closed loop in the examination subject.

In actual applications, the distance between 3D surface regions of the two body parts in each body part pair may be represented by the distance between the two closest points on the 3D surface regions of the two body parts. For example, for two body parts A, B in a body part pair, the distances between each point in the 3D surface region of body part A and each point in the 3D surface region of body part B are separately calculated, and the smallest of these distances is then the distance between the 3D surface regions of body parts A, B.

Once it has been determined that there is a risk of a closed loop in the examination subject, a body part pair at risk of suffering a closed loop may be combined with whether the examination subject enters the bore head first or feet first, to determine the name of a body part at risk of suffering a closed loop, and notify the examination subject or/and the scan technician of the name of the body part at risk of suffering a closed loop. For example: for parts such as the hands and feet, it is necessary to distinguish between left and right, so in this case, it is necessary to refer to whether the examination subject enters the bore head first or feet first to determine whether a part is left or right.

In the embodiment above, a closed loop in an examination subject in MRI can be detected by acquiring 3D coordinates of key characteristic points of the MRI examination subject, adapting the 3D coordinates of key characteristic points to a 3D body standard model to obtain a 3D virtual body model of the examination subject, then extracting 3D surface regions of pre-designated body parts from the 3D virtual body model, and based on pre-defined body part pairs where skin contact is likely to occur, calculating a distance between 3D surface regions of the two body parts in each body part pair, and determining that there is currently a risk of a closed loop in the examination subject if the distance between the 3D surface regions of the two body parts in any body part pair is less than a preset first threshold.

In the embodiment above, the distance between 3D surface regions of body parts where skin contact is likely to occur is detected, in order to detect whether there is currently a risk of a closed loop in the examination subject; in actual applications, it is also possible to detect whether there is currently a risk of a closed loop in the examination subject based on the distance between key characteristic points where crossed positioning is likely to occur.

In an exemplary embodiment, step 201 may further comprise the following, after acquiring the 3D coordinates of key characteristic points of the MRI examination subject: detecting whether there is currently crossed positioning in the examination subject according to the 3D coordinates of key characteristic points of the examination subject, and if so, determining that there is currently a risk of a closed loop in the examination subject.

In an exemplary embodiment, the step of detecting whether there is currently crossed positioning in the examination subject, according to the 3D coordinates of key characteristic points of the examination subject, may comprise: based on pre-defined key characteristic point pairs where crossed positioning is likely to occur and 3D coordinates of key characteristic points, calculating a distance between the two key characteristic points in each key characteristic point pair, and if the distance between the two key characteristic points in any key characteristic point pair is less than a preset second threshold, determining that there is currently crossed positioning in the examination subject; or inputting 3D coordinates of key characteristic points of the examination subject into a pre-trained deep learning network model for crossed positioning detection, so as to detect whether there is currently crossed positioning in the examination subject.

For example, if the distance between characteristic points of the left and right wrists is less than a preset second threshold, it is concluded that crossed positioning of the left and right palms has occurred, and there is currently a risk of a closed loop in the examination subject.

In actual applications, when the first solution (detecting whether there is currently a risk of a closed loop in the examination subject by detecting the distance between 3D surface regions of body parts where skin contact is likely to occur) and the second solution (detecting whether there is currently a risk of a closed loop in the examination subject based on the distance between key characteristic points where crossed positioning is likely to occur) are used simultaneously, an alert may be issued to the examination subject if either solution detects that there is currently a risk of a closed loop in the examination subject, or a closed loop alert may be issued to the examination subject only if both solutions detect that there is currently a risk of a closed loop in the examination subject.

In actual applications, by combining the two solutions for closed loop detection, the risk of a closed loop in the examination subject can be detected more comprehensively and effectively.

When the two solutions for closed loop detection are combined, then in step 204, if the distance between the 3D surface regions of the two body parts in any body part pair is less than a preset first threshold, the following is included before determining that there is currently a risk of a closed loop in the examination subject: judging whether it is detected that there is currently crossed positioning in the examination subject, and if so, determining that there is currently a risk of a closed loop in the examination subject.

In an exemplary embodiment, after determining that there is currently a risk of a closed loop in the examination subject, the method may further comprise: issuing a closed loop alert to the examination subject; or/and issuing a closed loop alert to the examination subject and giving guidance for correct positioning.

There are no restrictions on the form and specific nature of the closed loop alert issued to the examination subject and the guidance given for correct positioning, which may be in text or/and voice or/and image form.

It should be explained that embodiments of the present disclosure may be applied in an MRI scan preparation stage to guide an examination subject to achieve correct positioning, and may also be applied in an MRI formal scanning stage to promptly detect when there is a risk of a closed loop in the examination subject and issue a reminder, thus realizing detection of whether there is a risk of a closed loop in the examination subject throughout the MRI process, greatly reducing labor costs, increasing the speed of MRI scanning and improving MRI scanning safety.

Furthermore, in embodiments of the present disclosure, when positioning of the examination subject is complete, an examination subject positioning image of this moment may be acquired, so that if bodily injury caused by a closed loop occurs subsequently, the examination subject positioning image may be used to investigate the cause.

Figure 7:
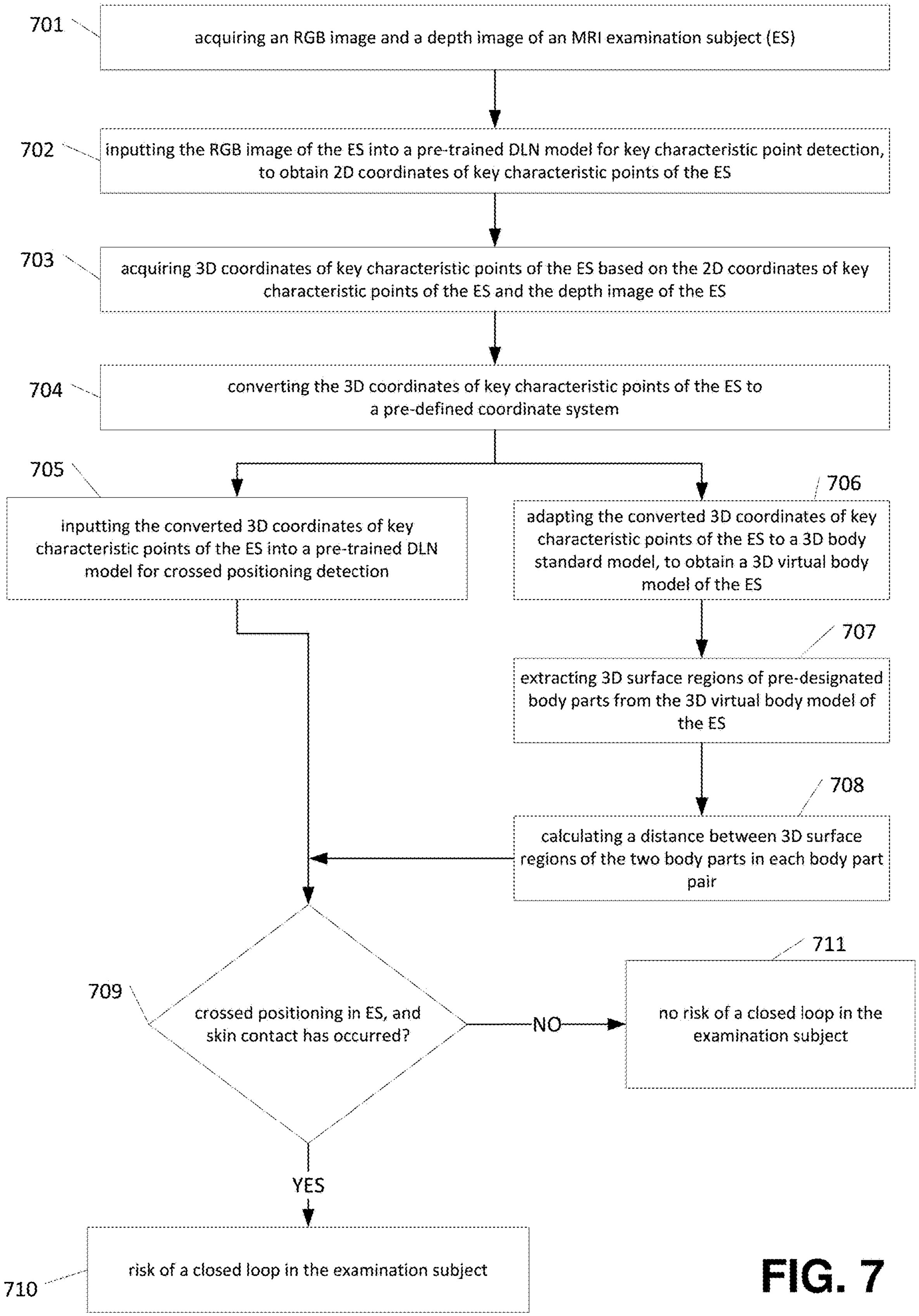
FIG. 7 is a flowchart of a method for detecting a closed loop in MRI according to one or more exemplary embodiments of the disclosure.

FIG. 7 is a flow chart of a method for detecting a closed loop in MRI as provided in another embodiment of the present disclosure, the specific steps of the method may include:

Step 701: acquiring an RGB image and a depth image of an MRI examination subject.

Step 702: inputting the RGB image of the examination subject into a pre-trained deep learning network model for key characteristic point detection, to obtain 2D coordinates of key characteristic points of the examination subject.

Step 703: acquiring 3D coordinates of key characteristic points of the examination subject according to the 2D coordinates of key characteristic points of the examination subject and the depth image of the examination subject.

Step 704: converting the 3D coordinates of key characteristic points of the examination subject to a pre-defined coordinate system.

Step 705: inputting the converted 3D coordinates of key characteristic points of the examination subject into a pre-trained deep learning network model for crossed positioning detection, and the model outputting an indication of whether there is currently crossed positioning in the examination subject.

Step 706: adapting the converted 3D coordinates of key characteristic points of the examination subject to a 3D body standard model, to obtain a 3D virtual body model of the examination subject.

Step 707: extracting 3D surface regions of pre-designated body parts from the 3D virtual body model of the examination subject.

Step 708: based on pre-defined body part pairs where skin contact is likely to occur, calculating a distance between 3D surface regions of the two body parts in each body part pair; and if the distance between the 3D surface regions of the two body parts in any body part pair is less than a preset first threshold, determining that skin contact has occurred between the two body parts.

Step 709: judging whether the following conditions are met: the model outputs an indication that there is currently crossed positioning in the examination subject in step 705, and skin contact has occurred in at least one body part pair in step 708; and if these conditions are met, performing step 710, otherwise performing step 711.

Step 710: determining that there is currently a risk of a closed loop in the examination subject, issuing a closed loop alert to the examination subject, and giving guidance for correct positioning, at which point this process ends.

Step 711: determining that there is currently no risk of a closed loop in the examination subject, at which point this process ends.

In actual applications, step 705 and steps 706-708 may be performed in parallel.

Furthermore, steps 701-711 are performed in real time during the MRI process (including the scan preparation stage and the formal scanning stage), so as to achieve the objective of detecting, in real time, whether there is a closed loop in the examination subject.

The embodiments of the present disclosure have the following beneficial technical effects:

1. The risk of a closed loop in the examination subject in MRI (including the scan preparation stage and the formal scanning stage) can be detected, thus lowering the labor cost of MRI, reducing the duration of the MRI scan preparation stage and increasing the MRI scanning speed; and the risk of a closed loop can be detected before formal scanning, thus increasing MRI scanning safety.
2. 3D coordinates of key characteristic points of the examination subject are acquired through the combination of an RGB image and a depth image, so even if the examination subject is covered by a coil or blanket, etc., the examination subject can be subjected to closed loop detection accurately.
3. By combining the first solution (detecting whether there is currently a risk of a closed loop in the examination subject by detecting the distance between 3D surface regions of body parts where skin contact is likely to occur) and the second solution (detecting whether there is currently a risk of a closed loop in the examination subject based on the distance between key characteristic points where crossed positioning is likely to occur), the risk of a closed loop in the examination subject can be detected more comprehensively and effectively.

Figure 8:
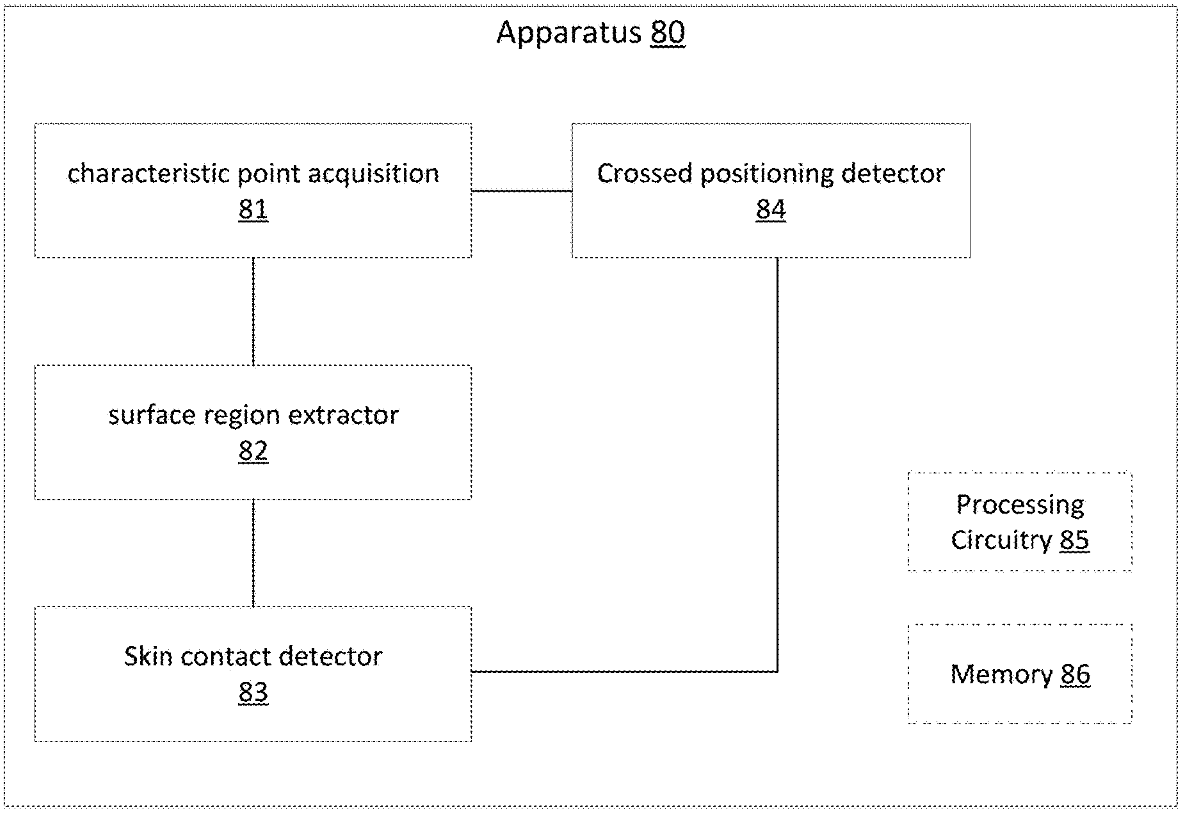
FIG. 8 shows an apparatus for detecting a closed loop in MRI according to one or more exemplary embodiments of the disclosure.

FIG. 8 is a structural schematic drawing of an apparatus 80 for detecting a closed loop in MRI according to the disclosure. The apparatus 80 may include:

- a key characteristic point acquisition module 81 configured to acquire 3D coordinates of key characteristic points of an MRI examination subject;
- a 3D surface region extraction module 82 configured to adapt the 3D coordinates of key characteristic points of the examination subject to a 3D body standard model, to obtain a 3D virtual body model of the examination subject; and extracting 3D surface regions of pre-designated body parts from the 3D virtual body model of the examination subject; and
- a skin contact detection module 83 configured to calculate, based on pre-defined body part pairs where skin contact is likely to occur, a distance between 3D surface regions of the two body parts in each body part pair; and if the distance between the 3D surface regions of the two body parts in any body part pair is less than a preset first threshold, determining that there is currently a risk of a closed loop in the examination subject.

In an exemplary embodiment, the key characteristic point acquisition module 81 acquiring 3D coordinates of key characteristic points of an MRI examination subject may comprise: acquiring an RGB image and a depth image of the examination subject; detecting key characteristic points in the RGB image of the examination subject, and recording 2D coordinates of the key characteristic points; and acquiring 3D coordinates of the key characteristic points according to the 2D coordinates of the key characteristic points and the depth image of the examination subject.

In an exemplary embodiment, the key characteristic point acquisition module 81 detecting key characteristic points in the RGB image of the examination subject may comprise: inputting the RGB image of the examination subject into a pre-trained deep learning network model for key characteristic point detection, to obtain 2D coordinates of key characteristic points of the examination subject.

In actual applications, after the key characteristic point acquisition module 81 has acquired 3D coordinates of key characteristic points of an MRI examination subject, the following is further included: converting the 3D coordinates of key characteristic points to a pre-defined coordinate system.

In an exemplary embodiment, the apparatus 80 may further comprise: a crossed positioning detection module 84, for detecting whether there is currently crossed positioning in the examination subject according to the 3D coordinates of key characteristic points, and if so, determining that there is currently a risk of a closed loop in the examination subject.

In an exemplary embodiment, the crossed positioning detection module 84 detecting whether there is currently crossed positioning in the examination subject, according to the 3D coordinates of key characteristic points, may comprise: based on pre-defined key characteristic point pairs where crossed positioning is likely to occur and 3D coordinates of key characteristic points of body parts, calculating a distance between the two key characteristic points in each key characteristic point pair, and if the distance between the two key characteristic points in any key characteristic point pair is less than a preset second threshold, determining that there is currently crossed positioning in the examination subject; or inputting 3D coordinates of key characteristic points of the examination subject into a pre-trained deep learning network model for crossed positioning detection, so as to detect whether there is currently crossed positioning in the examination subject.

In an exemplary embodiment, after the skin contact detection module 83 has determined that the distance between the 3D surface regions of the two body parts in any body part pair is less than the preset first threshold, but before determining that there is currently a risk of a closed loop in the examination subject, the following is further included: judging whether the crossed positioning detection module (84) detects that there is currently crossed positioning in the examination subject, and if so, determining that there is currently a risk of a closed loop in the examination subject.

In an exemplary embodiment, after the skin contact detection module 83 has determined that there is currently a risk of a closed loop in the examination subject, the following is further included: issuing a closed loop alert to the examination subject; or/and issuing a closed loop alert to the examination subject and giving guidance for correct positioning.

In an exemplary embodiment, the apparatus 80 includes processing circuitry that is configured to perform one or more functions and/or operations of the apparatus 80. Additionally, or alternatively, one or more of the components (e.g., 81, 82, 83, 84) may include processing circuitry that is configured to perform respective function(s) and/or operation(s) of the component(s). Additionally, or alternatively, the apparatus 80 (and/or one or more components therein) may include one or more memory units 86 to store data and/or instructions. The various "modules" of the apparatus 80 may be implemented by the processing circuitry 85. Although the processing circuitry 85 is shown as a separate component of the apparatus 80, one or more of the modules 81, 82, 83, 84 may be modules of the processing circuitry 85.

Embodiments of the present disclosure further provide an MRI system, where the MRI system may include the apparatus 80 configured to detect a closed loop in MRI according to the disclosure. The MRI system may include a MR scanner configured to obtain MRI data, and which may be controlled by the apparatus 80. The apparatus 80 may be referred to a controller in one or more aspects.

Those skilled in the art will understand that features stated in embodiments and/or claims of the present disclosure can be combined and/or integrated in various ways, even if such combinations or integrations are not clearly stated in the present application. In particular, without departing from the spirit and teaching of the present application, features stated in embodiments and/or claims of the present application can be combined and/or integrated in various ways, and all such combinations and/or integrations fall within the scope of disclosure of the present application.

Specific embodiments have been used herein to expound the principles and forms of implementation of the present application, but the description of the embodiments above is merely intended to help understand the method of the present application and the core idea thereof, not to restrict the present application. Those skilled in the art can make changes in terms of the specific form of implementation and the application scope, based on the idea, spirit and principles of the present application, and any modification, equivalent replacement or improvement, etc. that is made should be included in the scope of protection of the present application.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

The various components described herein may be referred to as "modules," "units," or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, units, or devices, as applicable and relevant, may alternatively be referred to herein as "circuitry," "controllers," "processors," or "processing circuitry," or alternatively as noted herein.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST

11, 12 Skin contact between the two hands
13 Skin contact between the two legs
14, 15 Skin contact between a hand and the torso
16 Skin contact between the inner sides of the two thighs
201-204 Steps
31 3D camera;
32 Examination table
33 Example of an examination subject
34 Example of a depth image of an examination subject
51 Example of key characteristic points of examination subject
52 Example of 3D virtual body model of examination subject obtained by adaptation
61 3D surface region of right foot
701-711 Steps
80 Apparatus for detecting closed loop in MRI
81 Key characteristic point acquisition module
82 3D surface region extraction module
83 Skin contact detection module
84 Crossed positioning detection module

The invention claimed is:

1. A method for detecting a closed loop in magnetic resonance imaging (MRI), comprising:

acquiring three-dimensional (3D) coordinates of key characteristic points of an MRI examination subject;

adapting the 3D coordinates of the key characteristic points to a 3D body standard model, to obtain a 3D virtual body model of the examination subject;

extracting 3D surface regions of pre-designated body parts from the 3D virtual body model;

based on pre-defined body part pairs where skin contact is likely to occur, calculating a distance between 3D surface regions of two body parts in each body part pair; and determining, based on the distance between the 3D surface regions of the two body parts in any body part pair, an existence of a risk of a closed loop in the examination subject.

2. The method as claimed in claim 1, wherein the existence of the risk of the closed loop in the examination subject is determined in response to the distance between the 3D surface regions of the two body parts in any body part pair being less than a preset threshold.

3. The method as claimed in claim 1, wherein acquiring 3D coordinates of key characteristic points of an MRI examination subject comprises:

acquiring a red-green-blue (RGB) image and a depth image of the MRI examination subject;

detecting key characteristic points in the RGB image of the examination subject, and recording 2D coordinates of the detected key characteristic points; and acquiring 3D coordinates of the key characteristic points based on the 2D coordinates of the key characteristic points and the depth image of the examination subject.

4. The method as claimed in claim 3, wherein detecting key characteristic points in the RGB image of the examination subject comprises: inputting the RGB image of the examination subject into a pre-trained deep learning network model for key characteristic point detection, to obtain 2D coordinates of key characteristic points of the examination subject.

5. The method as claimed in claim 1, further comprising, after acquiring 3D coordinates of key characteristic points of an MRI examination subject, and before adapting the 3D coordinates of the key characteristic points to a 3D body standard model, converting the 3D coordinates of the key characteristic points to a pre-defined coordinate system.

6. The method as claimed in claim 1, further comprising, after acquiring 3D coordinates of key characteristic points of an MRI examination subject:

detecting whether there is currently crossed positioning in the examination subject according to the 3D coordinates of the key characteristic points, and in response to a presence of the currently crossed positioning in the examination subject, determining that there is currently a risk of a closed loop in the examination subject.

7. The method as claimed in claim 6, wherein detecting whether there is currently crossed positioning in the examination subject, according to the 3D coordinates of the key characteristic points, comprises:

based on pre-defined key characteristic point pairs where crossed positioning is likely to occur and the 3D coordinates of the key characteristic points, calculating a distance between the key characteristic points in each key characteristic point pair, and in response to the distance between the two key characteristic points in any key characteristic point pair being less than a preset threshold, determining that there is currently crossed positioning in the examination subject; or inputting the 3D coordinates of the key characteristic points of the examination subject into a pre-trained deep learning network model for crossed positioning detection, so as to detect whether there is currently crossed positioning in the examination subject.

8. The method as claimed in claim 6, wherein, in response to the distance between the 3D surface regions of the two body parts in any body part pair being less than a preset threshold, the method further comprising, before determining that there is currently a risk of a closed loop in the examination subject:

determining whether currently crossed positioning in the examination subject is detected, and in response to currently crossed positioning in the examination subject being detected, determining that there is currently a risk of a closed loop in the examination subject.

9. The method as claimed in claim 1, wherein after determining that there is currently a risk of a closed loop in the examination subject, the method further comprises:

issuing a closed loop alert to the examination subject; and/or issuing a closed loop alert to the examination subject and giving guidance for correct positioning.

10. An apparatus for detecting a closed loop in magnetic resonance imaging (MRI), comprising:

a key characteristic point acquisition module configured to acquire three-dimensional (3D) coordinates of key characteristic points of an MRI examination subject;

a 3D surface region extractor configured to: adapt the 3D coordinates of the key characteristic points to a 3D body standard model, to obtain a 3D virtual body model of the examination subject; and extract 3D surface regions of pre-designated body parts from the 3D virtual body model; and a skin contact detector configured to: calculate, based on pre-defined body part pairs where skin contact is likely to occur, a distance between 3D surface regions of the two body parts in each body part pair; and in response to the distance between the 3D surface regions of the two body parts in any body part pair being less than a preset first threshold, determining that there is currently a risk of a closed loop in the examination subject.

11. The apparatus as claimed in claim 10, wherein, to acquire 3D coordinates of key characteristic points of an MRI examination subject, the key characteristic point acquisition module is configured to:

acquire a red-green-blue (RGB) image and a depth image of the MRI examination subject;

detect key characteristic points in the RGB image of the examination subject, and recording 2D coordinates of the key characteristic points; and acquire 3D coordinates of the key characteristic points based on the 2D coordinates of the key characteristic points and the depth image of the examination subject.

12. The apparatus as claimed in claim 11, wherein the key characteristic point acquisition module is configured to input the RGB image of the examination subject into a pre-trained deep learning network model for key characteristic point detection, to obtain 2D coordinates of key characteristic points of the examination subject.

13. The apparatus as claimed in claim 10, wherein, after the key characteristic point acquisition module has acquired 3D coordinates of key characteristic points of an MRI examination subject, the key characteristic point acquisition module is configured to convert the 3D coordinates of the key characteristic points to a pre-defined coordinate system.

14. The apparatus as claimed in claim 10, further comprising: a crossed positioning detector configured to: detect a crossed positioning in the examination subject according to the 3D coordinates of the key characteristic points, and in response to a detection of the crossed positioning, determine that there is currently a risk of a closed loop in the examination subject.

15. The apparatus as claimed in claim 14, wherein, to detect the crossed positioning in the examination subject, the crossed positioning detector is configured to:

based on pre-defined key characteristic point pairs where crossed positioning is likely to occur and the 3D coordinates of the key characteristic points, calculate a distance between the two key characteristic points in each key characteristic point pair, and in response to the distance between the two key characteristic points in any key characteristic point pair being less than a preset second threshold, determining that there is currently crossed positioning in the examination subject; or input the 3D coordinates of the key characteristic points of the examination subject into a pre-trained deep learning network model for crossed positioning detection, so as to detect whether there is currently crossed positioning in the examination subject.

16. The apparatus as claimed in claim 14, wherein, after determining that the distance between the 3D surface regions of the two body parts in any body part pair is less than the preset first threshold, and before determining that there is currently a risk of a closed loop in the examination subject, the skin contact detector is further configured to determine there is currently a risk of a closed loop in the examination subject in response to a detection that there is currently crossed positioning in the examination subject.

17. The apparatus as claimed in claim 10, wherein, after determining that there is currently a risk of a closed loop in the examination subject, the skin contact detector is configured to:

issue a closed loop alert to the examination subject; and/or issue a closed loop alert to the examination subject and giving guidance for correct positioning.

18. A magnetic resonance imaging (MRI) system comprising the apparatus of claim 10.

* * * * *